(12) United States Patent
Komukai (10) Patent No.: US 12,259,663 B2
(45) Date of Patent: Mar. 25, 2025

(54) TEMPLATE, METHOD FOR FABRICATING TEMPLATE, AND METHOD FOR FABRICATING SEMICONDUCTOR DEVICE

(71) Applicant: Kioxia Corporation, Tokyo (JP)

(72) Inventor: Toshiaki Komukai, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 630 days.

(21) Appl. No.: 17/399,854

(22) Filed: Aug. 11, 2021

(65) Prior Publication Data

US 2022/0050392 A1 Feb. 17, 2022

(30) Foreign Application Priority Data

Aug. 12, 2020 (JP) ................. 2020-136343

(51) Int. Cl.
| | | |
|---|---|---|
| *G03F 7/075* | (2006.01) | |
| *G03F 7/20* | (2006.01) | |
| *G03F 9/00* | (2006.01) | |
| *H01L 21/027* | (2006.01) | |

(52) U.S. Cl.
CPC ............ *G03F 9/7042* (2013.01); *G03F 7/075* (2013.01); *G03F 7/2012* (2013.01); *H01L 21/027* (2013.01)

(58) Field of Classification Search
CPC ...... G03F 9/7042; G03F 7/075; G03F 7/2012; G03F 7/0002; H01L 21/027

USPC ......................................................... 438/401
See application file for complete search history.

(56) References Cited

U.S. PATENT DOCUMENTS

| | | | | |
|---|---|---|---|---|
| 2003/0175532 A1* | 9/2003 | Asayama | ................ | C30B 15/00 428/64.1 |
| 2011/0290134 A1* | 12/2011 | Itoh | ........................ | B82Y 10/00 438/758 |
| 2013/0001753 A1* | 1/2013 | Kanamitsu | ............. | B82Y 10/00 257/E29.022 |
| 2018/0264712 A1 | 9/2018 | Asano | | |
| 2020/0073228 A1* | 3/2020 | Tanaka | ................ | H01L 21/0271 |

FOREIGN PATENT DOCUMENTS

| | | |
|---|---|---|
| JP | 2007-320246 | 12/2007 |
| JP | 2018-152515 | 9/2018 |
| JP | 2019-004170 | 1/2019 |
| JP | 2019-009469 | 1/2019 |
| JP | 2019-041126 | 3/2019 |

* cited by examiner

*Primary Examiner* — Jami Valentine Miller
*Assistant Examiner* — Ashley Nicole Blackwell
(74) *Attorney, Agent, or Firm* — Foley & Lardner LLP (57) ABSTRACT

A template includes: a base material having a principal surface; a mesa structure provided on the principal surface and having a first surface; and a silicon film that is provided on the first surface of the mesa structure, has a projection-and-depression pattern, and is made of a material different from a material for the base material.

14 Claims, 10 Drawing Sheets

CROSS SECTION A-A'

CROSS SECTION A-A'

CROSS SECTION B-B'

TEMPLATE, METHOD FOR FABRICATING TEMPLATE, AND METHOD FOR FABRICATING SEMICONDUCTOR DEVICE

CROSS-REFERENCE TO RELATED APPLICATION(S)

This application is based upon and claims the benefit of priority from Japanese Patent Application No. 2020-136343, filed Aug. 12, 2020, the entire contents of which are incorporated herein by reference.

FIELD

Embodiments described herein relate generally to a template, a method for fabricating the template, and a method for fabricating a semiconductor device.

BACKGROUND

In lithography in semiconductor device fabrication, nanoimprint lithography is proposed as a pattern transfer method designed to replace optical lithography. In nanoimprint lithography, a template with a pattern formed therein is directly pressed against a substrate with a liquid organic material applied thereto, whereby the pattern is transferred to the substrate.

DETAILED DESCRIPTION

Embodiments provide a template and a method for fabricating the template, the template and the method which make it possible to increase the film thickness of a metal film that is formed on the bottom face of a groove of an alignment pattern.

In general, according to at least one embodiment, a template includes: a base material having a principal surface; a mesa structure provided on the principal surface and having a first surface; and a silicon film that is provided on the first surface of the mesa structure, has a projection-and-depression pattern, and is made of a material different from a material for the base material.

Hereinafter, at least one embodiment will be described with reference to the drawings. In the following description of the drawings, identical or similar portions are denoted by identical or similar reference signs. It is to be noted that the drawings are schematic drawings and the relationship between the thickness and the planar size, for example, is different from the actual relationship.

Figure 1A:
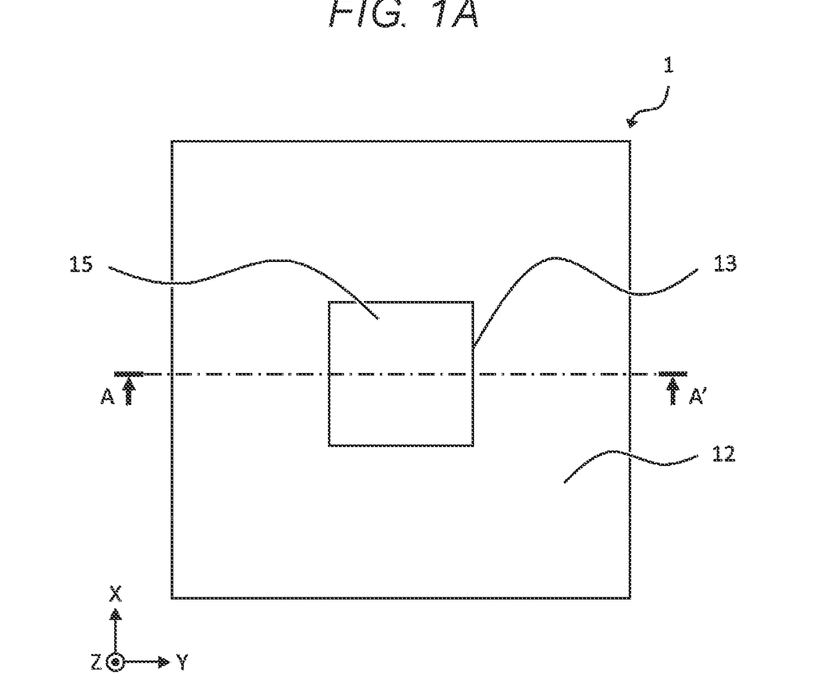
FIGS. 1A and 1B are diagrams showing the structure of a template according to at least one embodiment.
Figure 1B:
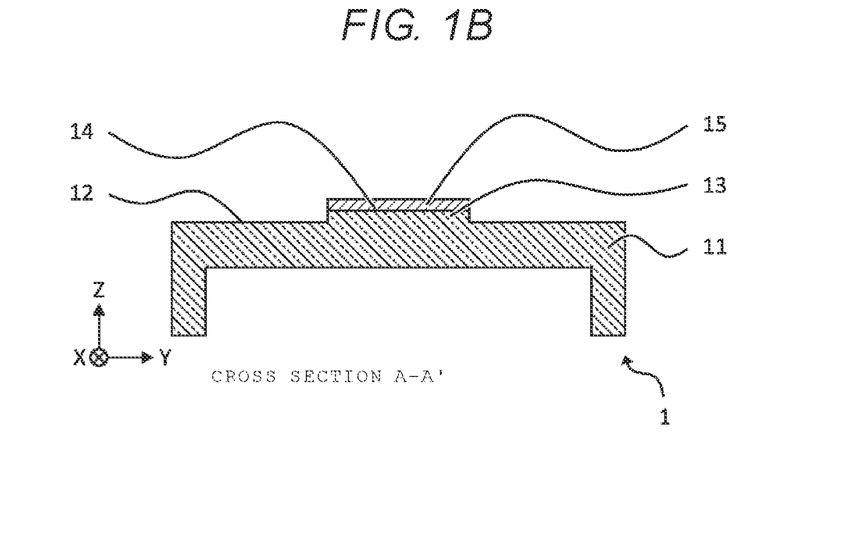
Figure 2A:
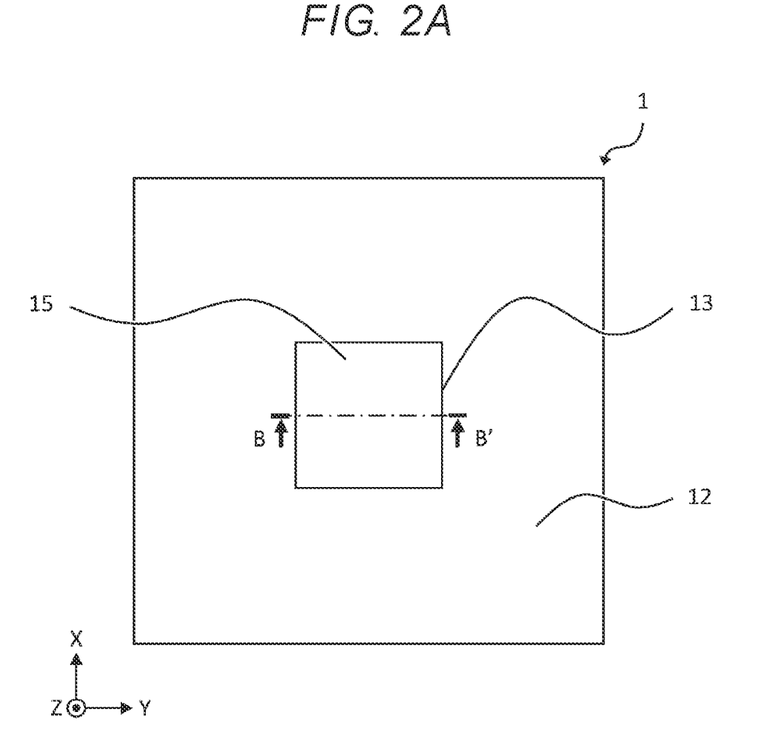
FIGS. 2A and 2B are diagrams showing the structure of the template according to at least one embodiment, following FIGS. 1A and 1B.
Figure 2B:
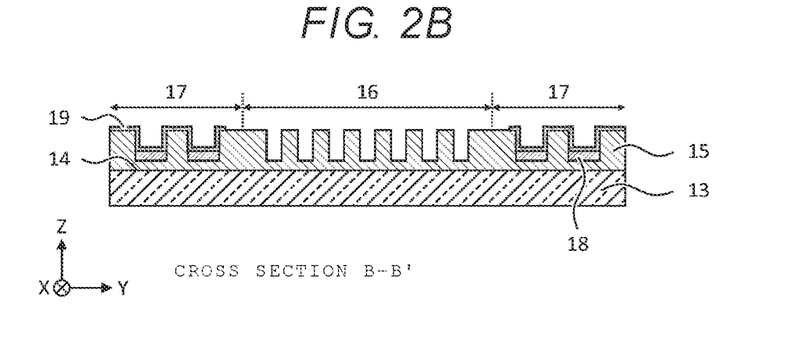

First, a template according to at least one embodiment will be described with reference to FIGS. 1A and 1B and FIGS. 2A and 2B. FIGS. 1A and 1B and FIGS. 2A and 2B are diagrams showing the structure of the template according to at least one embodiment. FIGS. 1A and 2A are plan views viewed from a Z direction. FIG. 1B is a sectional view along AA' viewed from an X direction. FIG. 2B is a sectional view along BB' viewed from the X direction.

As shown in FIGS. 1A and 1B, a template 1 is obtained by working on a base material 11 which is quadrilateral when viewed from the Z direction. In nanoimprint lithography using light, the template 1 contains quartz (a transparent material), for example. In the center of a principal surface 12 of the base material 11, a mesa structure 13 protruding from the principal surface 12 like a projection is provided. The mesa structure 13 has a principal face 14. A silicon film 15 is formed on the principal face 14. The silicon film 15 is made of a material different from the material for the base material 11, and contains monocrystalline or polycrystalline silicon, for example. The silicon film 15 has a projection-and-depression pattern and has grooves formed therein that form a transfer pattern and an alignment pattern.

The details of the transfer pattern and the alignment pattern formed in the silicon film 15 of the template 1 will be described in detail with reference to FIGS. 2A and 2B. As shown in FIG. 2B, the silicon film 15 is formed on the principal face 14 of the mesa structure 13. A transfer pattern 16 and an alignment pattern 17 are provided in the silicon film 15. In each of the transfer pattern 16 and the alignment pattern 17, grooves are provided. A metal film 18 is formed on the bottom faces of the grooves of the alignment pattern 17. The metal film 18 contains transition metal such as chromium, for example. Moreover, in the alignment pattern 17, a protective film 19 covering the upper surface of the silicon film 15, the inner side surfaces of the grooves provided in the silicon film 15, and the upper surface of the metal film 18 is formed. The protective film 19 contains a nitride film or an oxide film such as silicon nitride or silicon oxide, for example.

Next, a method for fabricating the template according to at least one embodiment will be described with reference to FIGS. 3A to 5D. FIGS. 3A to 5D are diagrams showing the method for fabricating the template according to at least one embodiment.

Figure 3A:
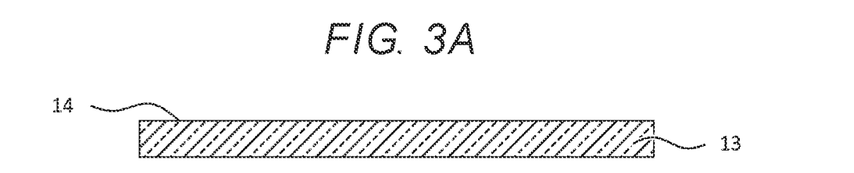
FIGS. 3A to 3D are diagrams showing a method for fabricating the template according to at least one embodiment.

First, as shown in FIG. 3A, a material template with a mesa structure 13 having a principal face 14 is prepared. The material template contains quartz (a transparent material), for example. It is to be noted that, in the drawings after FIG. 3D, a part of the material template is not shown.

Figure 3B:
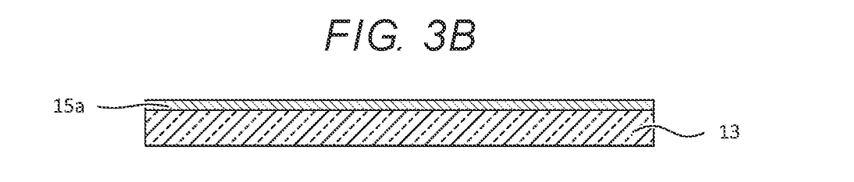

Next, as shown in FIG. 3B, a silicon film 15a is formed on the principal face 14 of the mesa structure 13. Examples of a method for forming the silicon film 15a include a method by which the mesa structure 13 and the silicon film 15a are layered and bonded together by high temperature processing.

Figure 3C:
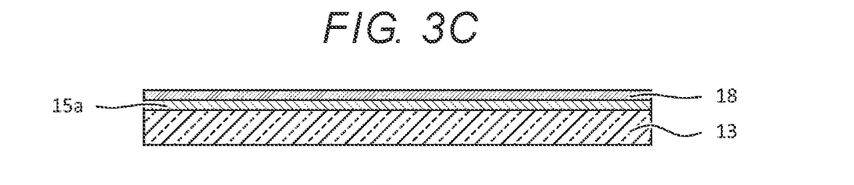

Then, as shown in FIG. 3C, a metal film 18 is formed on the silicon film 15a. The metal film 18 contains chromium, for example.

Figure 3D:
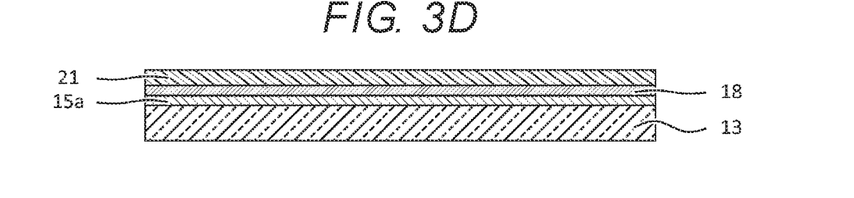

Next, as shown in FIG. 3D, a resist film 21 is formed on the metal film 18. The resist film 21 can be formed by, for example, applying a resist using spin coating and baking the resist. Examples of the resist include an electron resist.

Figure 4A:
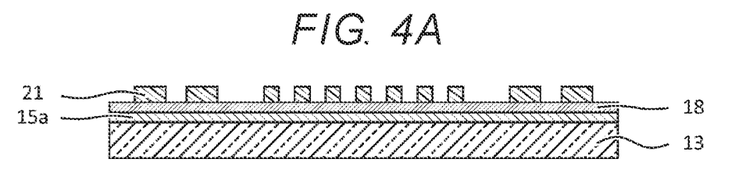
FIGS. 4A to 4D are diagrams showing the method for fabricating the template according to at least one embodiment, following FIG. 3D.

Then, as shown in FIG. 4A, a pattern is drawn in the resist film 21. When an electron resist is used as the resist film 21, drawing is performed by an electron beam.

Figure 4B:
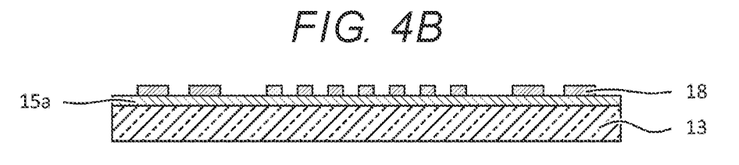

Next, as shown in FIG. 4B, the metal film 18 is etched using the pattern of the resist film 21 as a mask. This causes the pattern of the resist film 21 to be transferred to the metal film 18. After etching of the metal film 18, the resist film 21 is removed.

Figure 4C:
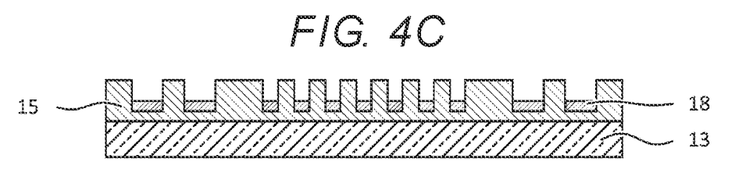

Then, as shown in FIG. 4C, a silicon film 15 is formed on the silicon film 15a using the pattern of the metal film 18 as a mask. The formation of the silicon film 15 is performed by epitaxial growth using chemical vapor deposition (CVD), for example. By doping impurities before heat treatment in the formation of the silicon film 15, it is possible to improve the efficiency of epitaxial growth. Examples of the impurities to be doped include boron, arsenic, phosphorus, and nitrogen. Moreover, it is preferable that the concentration of impurities is $1.0 \times 10^{19}$ atoms/cm$^3$ or more. This allows silicon to be grown from the periphery of the metal film 18, whereby the silicon film 15 with the metal film 18 embedded in the grooves is formed.

Figure 4D:
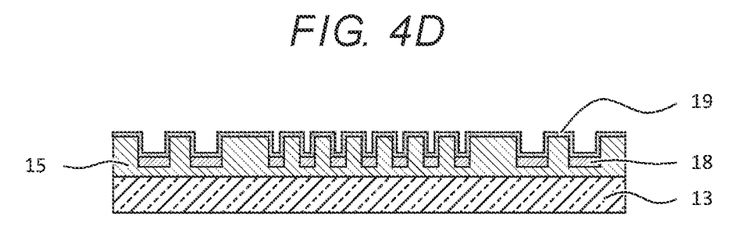

Next, as shown in FIG. 4D, a protective film 19 is formed on the upper surface and side surfaces of the silicon film 15 and the upper surface of the metal film 18. The protective film 19 is a silicon nitride film, for example, and can be formed by CVD.

Figure 5A:
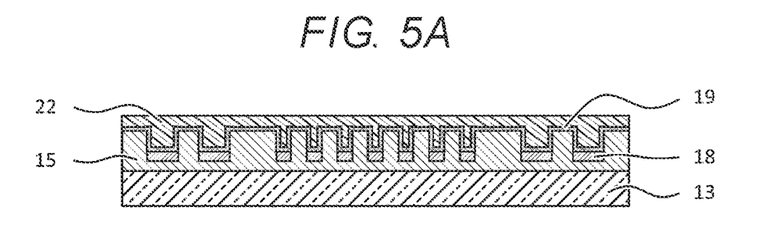
FIGS. 5A to 5D are diagrams showing the method for fabricating the template according to at least one embodiment, following FIG. 4D.

Then, as shown in FIG. 5A, a resist film 22 is formed on the protective film 19. The resist film 22 can be formed by, for example, applying a resist using spin coating and baking the resist. Examples of the resist include an electron resist.

Figure 5B:
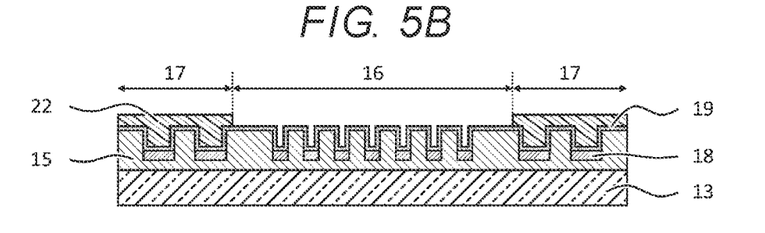

Next, as shown in FIG. 5B, a pattern is drawn in the resist film 22. By this drawing, a part of the resist film 22, which is formed on a transfer pattern 16, is removed. This causes the resist film 22 to remain on an alignment pattern 17. When an electron resist is used as the resist film 22, drawing is performed by irradiation with an electron beam.

Figure 5C:
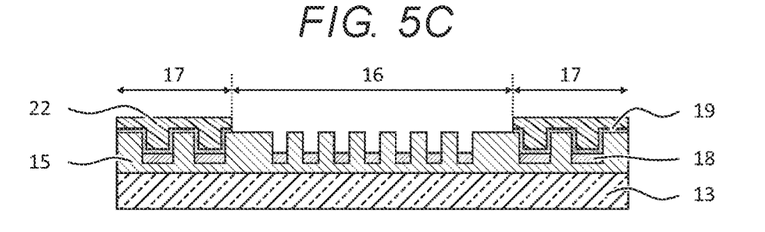

Then, as shown in FIG. 5C, the protective film 19 is etched using the resist film 22 on the alignment pattern 17 as a mask. As a result of the etching, the protective film 19 formed on the transfer pattern 16 is removed.

Figure 5D:
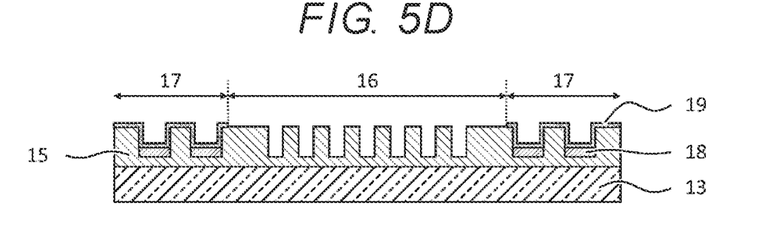

Next, as shown in FIG. 5D, the metal film 18 is etched using the resist film 22 on the alignment pattern 17 as a mask. As a result of the etching, the metal film 18 formed on the transfer pattern 16 is removed. After the etching of the metal film 18, the resist film 22 is removed.

Then, a method for fabricating a template according to a comparative example will be described with reference to FIGS. 6A to 8C. FIGS. 6A to 8C are diagrams showing the method for fabricating the template according to the comparative example.

Figure 6A:
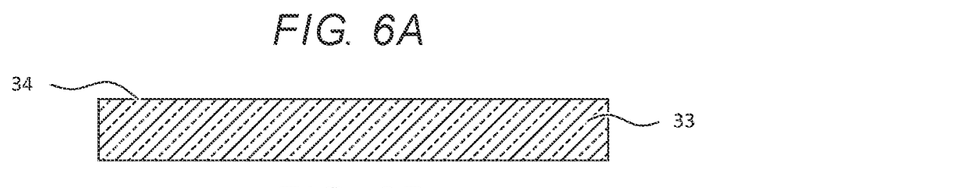
FIGS. 6A to 6D are diagrams showing a method for fabricating a template according to a comparative example.

First, as shown in FIG. 6A, a material template with a mesa structure 33 having a principal face 34 is prepared. The material template contains quartz (a transparent material), for example.

Figure 6B:
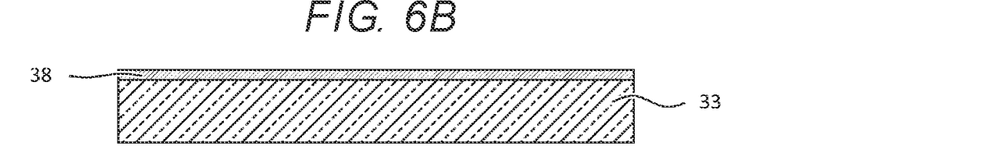

Next, as shown in FIG. 6B, a metal film 38 is formed on the principal face 34 of the mesa structure 33. The metal film 38 contains chromium, for example.

Figure 6C:
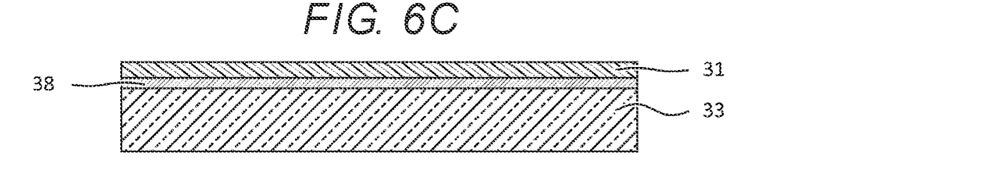

Then, as shown in FIG. 6C, a resist film 31 is formed on the metal film 38. The resist film 31 can be formed by, for example, applying a resist using spin coating and baking the resist. Examples of the resist include an electron resist.

Figure 6D:
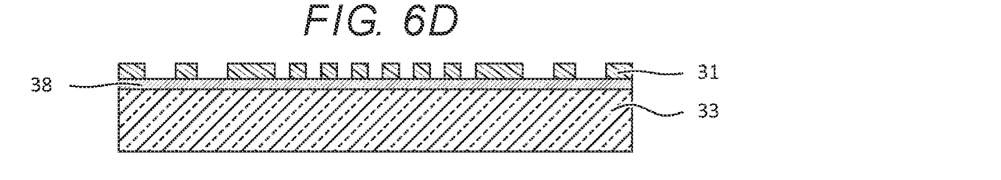

Next, as shown in FIG. 6D, a pattern is drawn in the resist film 31. When an electron resist is used as the resist film 31, drawing is performed by an electron beam.

Figure 7A:
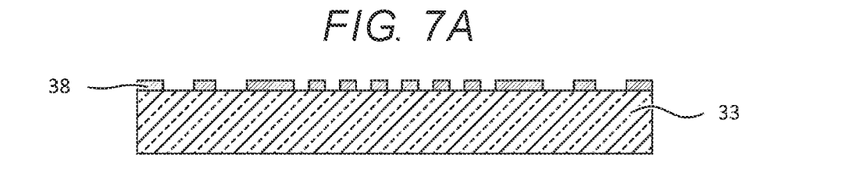
FIGS. 7A to 7D are diagrams showing the method for fabricating the template according to the comparative example, following FIG. 6D.

Then, as shown in FIG. 7A, the metal film 38 is etched using the pattern of the resist film 31 as a mask. As a result of the etching, the pattern of the resist film 31 is transferred to the metal film 38. After the etching of the metal film 38, the resist film 31 is removed.

Figure 7B:
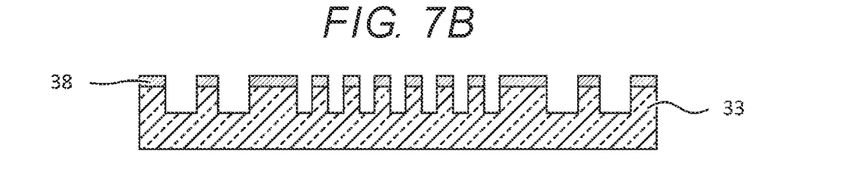

Next, as shown in FIG. 7B, the mesa structure 33 is etched using the pattern of the metal film 38 as a mask. As a result of the etching, the pattern of the metal film 38 is transferred to the mesa structure 33.

Figure 7C:
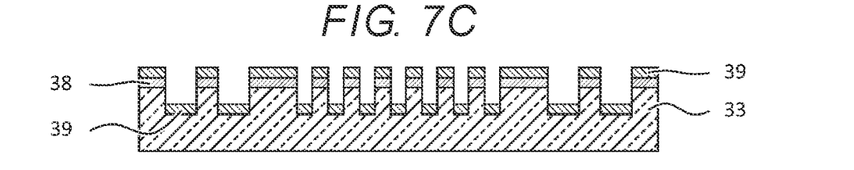

Then, as shown in FIG. 7C, a metal film 39 is formed on the bottom of a recess structure formed in the mesa structure 33 by etching and the front surface of the metal film 38. The metal film 39 contains chromium, for example.

Figure 7D:
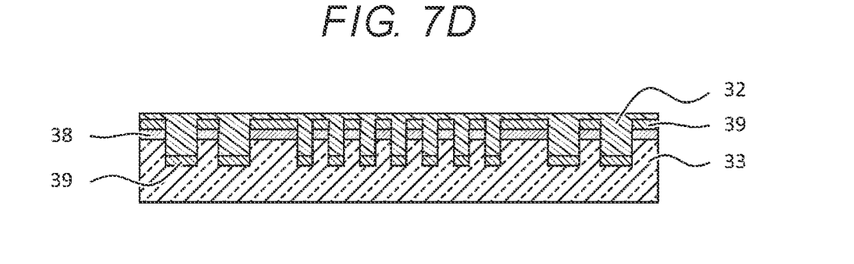

Next, as shown in FIG. 7D, a resist film 32 is formed on the mesa structure 33 and the metal film 39. The resist film 32 can be formed by, for example, applying a resist using spin coating and baking the resist. Examples of the resist include an electron resist.

Figure 8A:
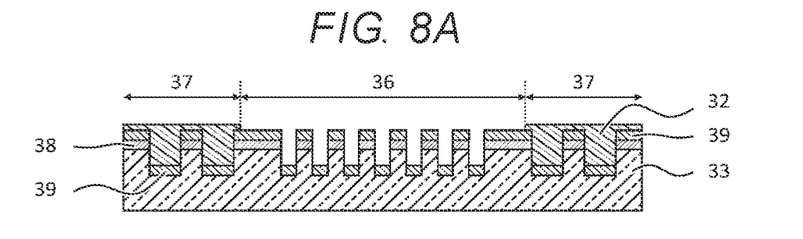
FIGS. 8A to 8C are diagrams showing the method for fabricating the template according to the comparative example, following FIG. 7D.

Then, as shown in FIG. 8A, a pattern is drawn in the resist film 32. By this drawing, a part of the resist film 32, which is formed on a transfer pattern 36, is removed. This causes the resist film 32 to remain on an alignment pattern 37. When an electron resist is used as the resist film 32, drawing is performed by an electron beam.

Figure 8B:
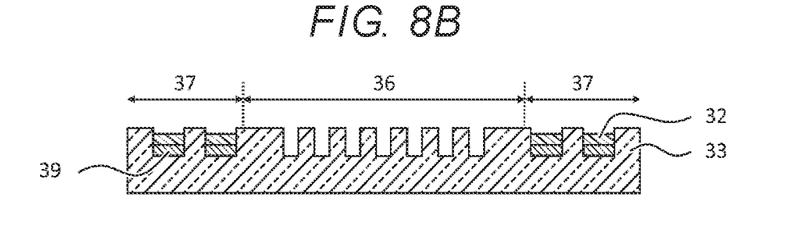

Next, as shown in FIG. 8B, the metal film 38, the metal film 39 formed on the metal film 38, and the metal film 39 formed on the transfer pattern 36 are removed using the resist film 32 as a mask.

Figure 8C:
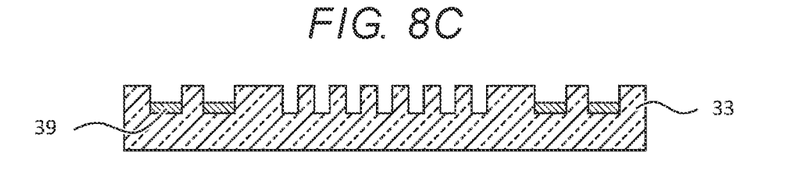

Then, as shown in FIG. 8C, the resist film 32 is removed. In this way, the template according to the comparative example can be fabricated.

In imprinting, in order to ensure the accuracy of alignment, it is necessary to ensure the strength of an alignment signal. This makes it necessary to increase the film thickness of a metal film which is formed on the bottom face of a groove of an alignment pattern. The film thickness of this metal film is gradually reduced by cleaning of a template, which is done every time imprinting is performed. Thus, it is preferable to make the metal film as thick as possible.

In the method for fabricating the template according to the comparative example, the metal film 39 is also formed on the transfer pattern 36. This makes it necessary to cover the metal film 39 formed in the grooves of the alignment pattern 37 with the resist film 32 and remove the metal film 39 formed in the grooves of the transfer pattern 36. In the comparative example, the metal film 38 and the metal film 39 are formed on the principal face 34 of the mesa structure 33, and the metal film 38 and the metal film 39 formed thereon also have to be removed together with the metal film 39 of the transfer pattern 36. Thus, in the course of also removing the metal film 38 and the metal film 39 formed thereon, the metal film 39 formed in the grooves of the alignment pattern 37 are also etched, which may reduce a film thickness.

On the other hand, in the template and the method for fabricating the template of at least one embodiment, the silicon film 15 is formed using the metal film 18 as a mask. Thus, there is no need to form a metal film on the principal face 14 of the mesa structure 13. This causes the metal film 18 to be formed in the grooves of the alignment pattern 17 less likely to be etched. Moreover, since the protective film 19 is present on the metal film 18, it is possible to prevent a reduction in the film thickness of the metal film 18, which may be caused by cleaning of the template.

Next, a method for fabricating a semiconductor device according to at least one embodiment will be described with reference to FIGS. 9A to 9E. FIGS. 9A to 9E are diagrams explaining a method for fabricating a semiconductor device using the template 1 according to at least one embodiment.

Figure 9A:
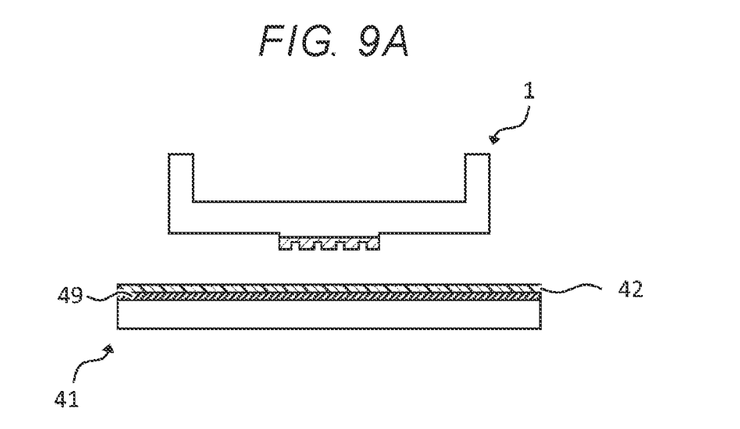
FIGS. 9A to 9E are diagrams showing a method for fabricating a semiconductor device according to at least one embodiment.

First, as shown in FIG. 9A, a photo-curable resist 42 is applied to a substrate-subject-to-transfer 41 including a semiconductor substrate. The substrate-subject-to-transfer 41 is a silicon substrate or an SOI substrate, for example, and a film-to-be-worked-on 49 may be formed on the front surface.

Figure 9B:
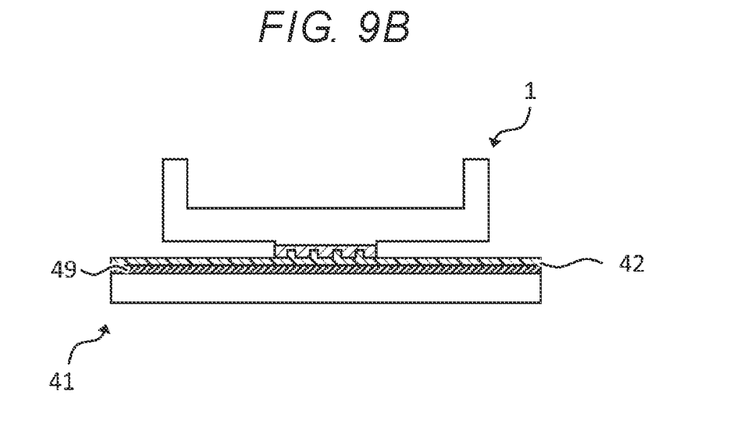

Next, as shown in FIG. 9B, the projection-and-depression pattern of the template 1 is brought into contact with the photo-curable resist 42. This causes the inside of the groove of the template 1 to be filled with the photo-curable resist 42.

Figure 9C:
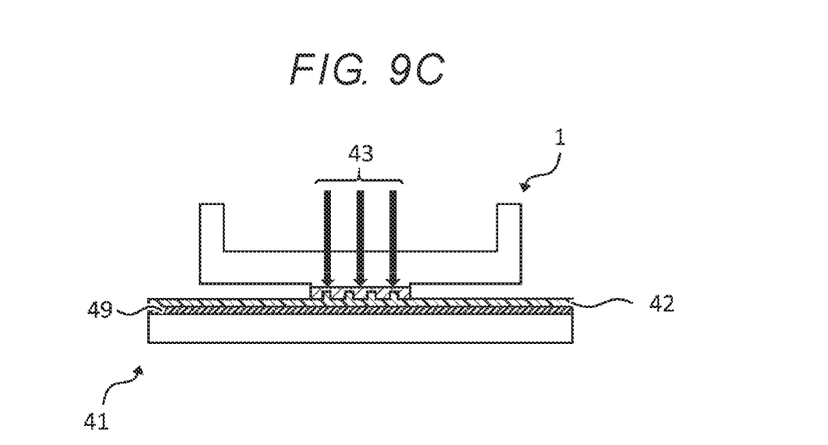

Then, as shown in FIG. 9C, the photo-curable resist 42 is irradiated with exposure light 43 with the projection-and-depression pattern of the template 1 being in contact with the photo-curable resist 42. This causes the photo-curable resist 42 to be cured.

Figure 9D:
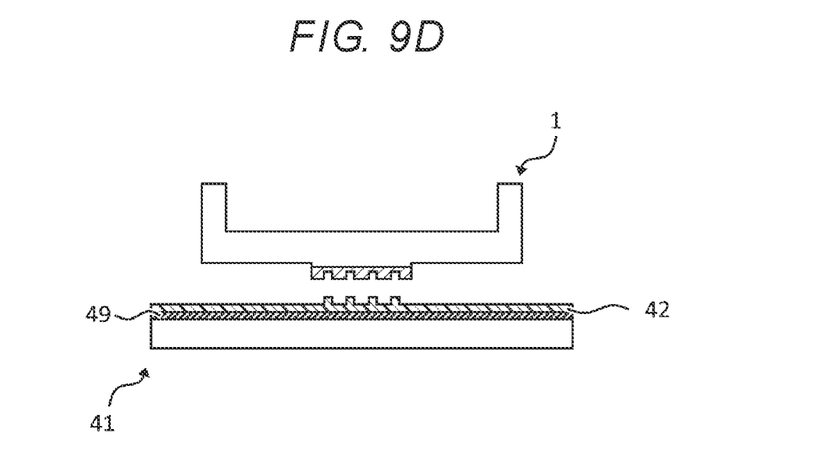
Figure 9E:
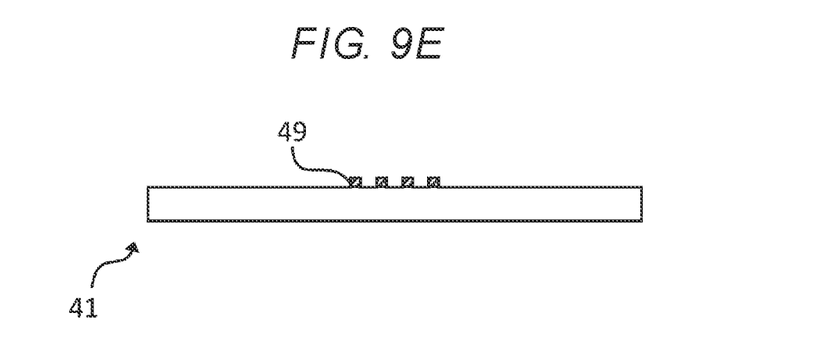

Next, as shown in FIG. 9D, the projection-and-depression pattern of the template 1 is separated from the cured photo-curable resist 42. Then, as shown in FIG. 9E, the substrate-subject-to-transfer 41 is etched using, as a mask, the photo-curable resist 42 separated from the projection-and-depression pattern of the template 1. As a result, the pattern of the template 1 is formed on the substrate-subject-to-transfer 41. In this case, when the film-to-be-worked-on 49 formed on the substrate-subject-to-transfer 41 is a polysilicon film or a metal film, fine electrode pattern, wiring pattern, and the like are formed. Moreover, when the film-to-be-worked-on 49 formed on the substrate-subject-to-transfer 41 is an insulating film, fine contact hole pattern, gate insulating film, and the like are formed. Furthermore, when the film-to-be-worked-on 49 is not formed on the substrate-subject-to-transfer 41 and an uppermost layer of the substrate is a semiconductor substrate, a fine device isolation groove and the like are formed.

In the method for fabricating a semiconductor device according to at least one embodiment, when a pattern is formed on the substrate-subject-to-transfer 41, the template 1 described in the at least one embodiment is used. This makes it possible to obtain the same effects as those of the template and the method for fabricating the template.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A template comprising:
   a base material having a principal surface;
   a mesa structure disposed on the principal surface and having a first surface; and
   a silicon film is disposed on the first surface of the mesa structure, the silicon film (i) having a projection-and-depression pattern, (ii) containing a material different from a material for the base material, and (iii) having a second surface directly contacting the first surface, wherein the silicon film contains monocrystalline or polycrystalline silicon.

2. The template according to claim 1, wherein the silicon film contains impurities.

3. The template according to claim 2, wherein a concentration of the impurities is $1.0 \times 10^{19}$ atoms/cm$^3$ or more.

4. The template according to claim 2, wherein the impurities contain at least one of boron, arsenic, phosphorus, or nitrogen.

5. The template according to claim 1, further comprising:
   a metal film disposed in some recess portions of the projection-and-depression pattern.

6. The template according to claim 5, further comprising:
   a film, which contains at least one of nitride or oxide, on the metal film.

7. The template according to claim 5, wherein the metal film contains at least one transition metal.

8. The template according to claim 1, wherein the silicon film includes a transfer pattern.

9. The template according to claim 8, wherein the silicon film includes an alignment pattern.

10. The template according to claim 9, wherein the transfer pattern and the alignment pattern include grooves.

11. The template according to claim 7, wherein the at least one transition metal includes chromium.

12. A method for fabricating a semiconductor device comprising:
    applying a first material light-curable film to a semiconductor substrate;
    bringing the projection-and-depression pattern of the template of claim 1 into contact with the first material film;
    curing the first material film; and
    separating the template from the first material film.

13. A template comprising:
    a base material having a principal surface;
    a mesa structure disposed on the principal surface and having a first surface; and
    a silicon film disposed on the first surface of the mesa structure, the silicon film (i) having a projection-and-depression pattern, (ii) containing a material different from a material for the base material, and (iii) having a second surface directly contacting the first surface,
    wherein the silicon film contains impurities.

14. A template comprising:
    a base material having a principal surface;
    a mesa structure disposed on the principal surface and having a first surface;
    a silicon film disposed on the first surface of the mesa structure, the silicon film (i) having a projection-and-depression pattern, (ii) containing a material different from a material for the base material, and (iii) having a second surface directly contacting the first surface;
    a metal film disposed in some recess portions of the projection-and-depression pattern; and
    a film, which contains at least one of nitride or oxide, on the metal film.

* * * * *